(12) United States Patent
Queen

(10) Patent No.: US 11,937,518 B2
(45) Date of Patent: Mar. 19, 2024

(54) MAGNETIC FLUX MITIGATION IN SUPERCONDUCTING CIRCUITS

(71) Applicant: Daniel Robert Queen, Kensington, MD (US)

(72) Inventor: Daniel Robert Queen, Kensington, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 137 days.

(21) Appl. No.: 17/749,298

(22) Filed: May 20, 2022

(65) Prior Publication Data

US 2023/0380301 A1  Nov. 23, 2023

(51) Int. Cl.
*H10N 60/80* (2023.01)
*H10N 60/01* (2023.01)

(52) U.S. Cl.
CPC ............ *H10N 60/80* (2023.02); *H10N 60/01* (2023.02)

(58) Field of Classification Search
CPC ......... H10N 60/80; H10N 60/01; H10N 69/00
See application file for complete search history.

(56) References Cited

U.S. PATENT DOCUMENTS

| 10,068,181 | B1 | 9/2018 | Rigetti et al. |
| 2010/0133514 | A1 | 6/2010 | Bunyk et al. |
| 2011/0268910 | A1* | 11/2011 | Bratkovski ........... H01F 1/0018 428/78 |
| 2015/0372217 | A1 | 12/2015 | Schoelkopf, III et al. |
| 2018/0013052 | A1 | 1/2018 | Oliver et al. |
| 2018/0247974 | A1* | 8/2018 | Oliver .................... H10N 60/12 |
| 2020/0075832 | A1* | 3/2020 | Burchard .............. C01B 32/205 |

OTHER PUBLICATIONS

Cho, et al.: "Through Silicon Via (TSV) Shielding Structures"; IEEE, Nov. 22, 2010, pp. 269-272, retrieved Jul. 7, 2023 on the internet @ https://ieeexplore.ieee.org/document/564590.

* cited by examiner

*Primary Examiner* — Yasser A Abdelaziez
(74) *Attorney, Agent, or Firm* — Tarolli, Sundheim, Covell & Tummino LLP

(57) ABSTRACT

One example includes a superconducting circuit. The circuit superconducting circuitry fabricated on a first surface of a circuit layer. The circuit layer includes a dielectric material. The circuit also includes a metal layer formed on a second surface of the circuit layer opposite the first surface and a through-substrate via (TSV) conductively coupled to the metal layer and extending through the circuit layer to the first surface. The circuit further includes a flux gasket conductively coupled to and extending from the TSV on the first surface proximal to the superconducting circuitry. The flux gasket can be configured to divert magnetic fields away from the superconducting circuitry.

20 Claims, 3 Drawing Sheets

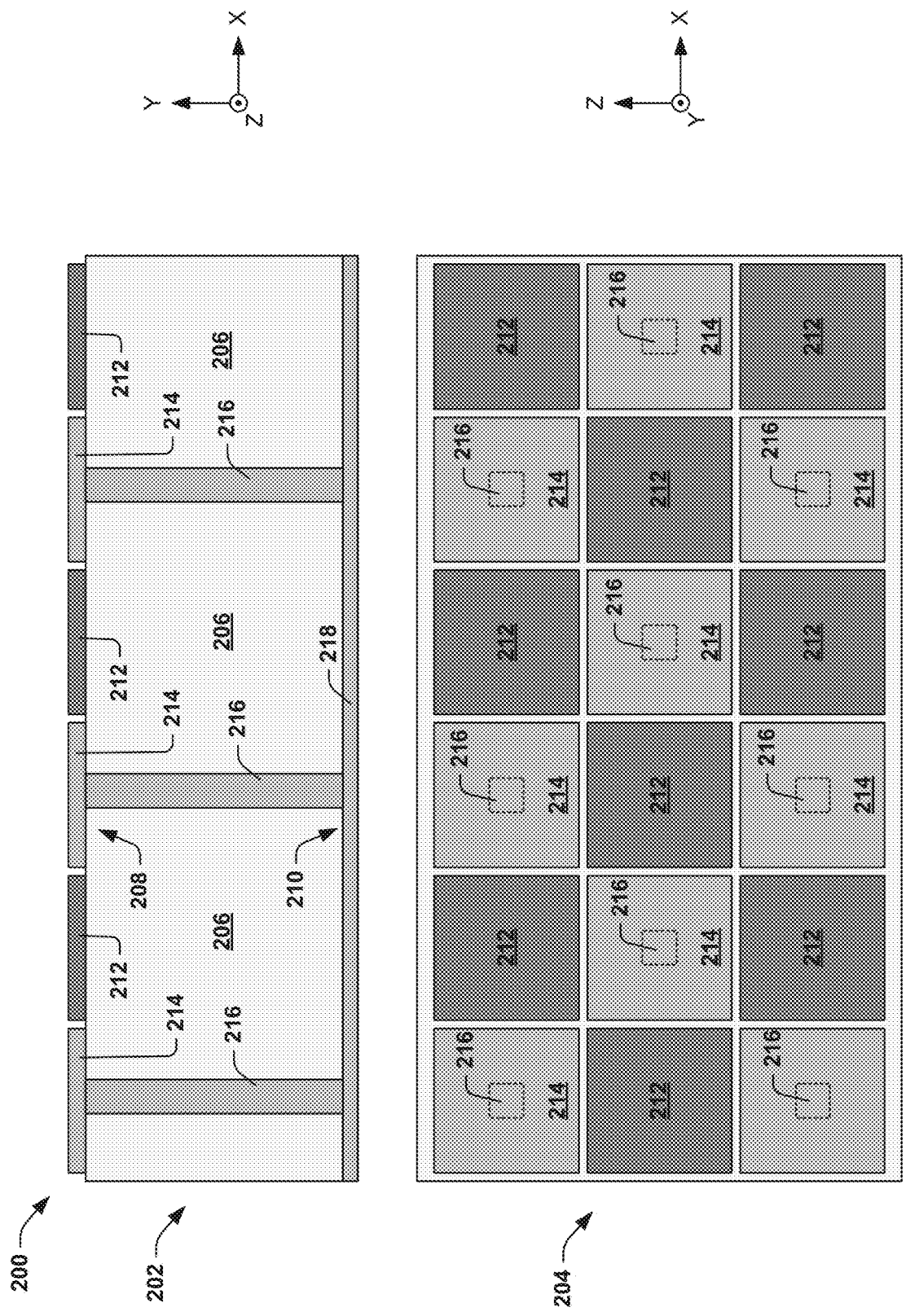

MAGNETIC FLUX MITIGATION IN SUPERCONDUCTING CIRCUITS

TECHNICAL FIELD

This description relates generally to electronic circuits, and more particularly to magnetic flux mitigation in superconducting circuits.

BACKGROUND

Superconducting circuits operate based on the behavior of superconducting metals in a cryogenic environment. For example, at very low cryogenic temperatures (e.g., less than 1K), superconducting metals can exhibit superconductivity in which electrons can propagate with approximately zero resistance. Typical superconducting circuits can operate based on being provided bias currents on bias inputs, such as to affect the triggering of Josephson junctions and/or to provide magnetic flux in superconducting loops. As a superconducting circuit is cooled from a typical ambient temperature environment to a cryogenic temperature, and thus a temperature less than a superconducting critical temperature for superconducting devices, noise currents can exhibit and propagate to the superconducting circuit via the bias inputs. Such noise currents can cause magnetic flux to exhibit on the superconducting loops and can remain, undissipated, causing flux traps that can deleteriously affect the operation of the superconducting circuit after the superconducting circuit is reduced to the cryogenic temperature.

SUMMARY

One example includes a superconducting circuit. The circuit includes superconducting circuitry fabricated on a first surface of a circuit layer. The circuit layer includes a dielectric material. The circuit also includes a metal layer formed on a second surface of the circuit layer opposite the first surface and a through-substrate via (TSV) conductively coupled to the metal layer and extending through the circuit layer to the first surface. The circuit further includes a flux gasket conductively coupled to and extending from the TSV on the first surface proximal to the superconducting circuitry. The flux gasket can be configured to divert magnetic fields away from the superconducting circuitry.

Another example described herein includes a method for fabricating a superconducting circuit. The method includes depositing a metallic material to form a metal layer and forming a TSV conductively coupled to and extending orthogonally from the metal layer. The method also includes depositing a dielectric material on the metal layer and surrounding the TSV to form a circuit layer. The circuit layer includes a first surface and a second surface opposite the first surface and in contact with the metal layer. The method also includes fabricating superconducting circuitry on the first surface of the circuit layer. The method further includes forming a flux gasket conductively coupled to and extending from the TSV on the first surface proximal to the superconducting circuitry. The flux gasket can be configured to divert magnetic fields away from the superconducting circuitry.

Another example described herein includes a superconducting circuit system. The system includes a first superconducting circuit system. The first superconducting circuit system includes first superconducting circuitry fabricated on a first surface of a first circuit layer. The first circuit layer includes a dielectric material. The first superconducting circuit system also includes a first metal layer formed on a second surface of the first circuit layer opposite the first surface and a first TSV conductively coupled to the first metal layer and extending through the first circuit layer to the first surface. The first superconducting circuit system further includes a first flux gasket conductively coupled to and extending from the first TSV on the first surface proximal to the first superconducting circuitry. The first flux gasket can be configured to divert magnetic fields away from the superconducting circuitry. The system also includes a second superconducting circuit system. The second superconducting circuit system includes second superconducting circuitry fabricated on a first surface of a second circuit layer. The second circuit layer comprising a dielectric material. The second superconducting circuit system also includes a second metal layer formed on a second surface of the second circuit layer opposite the first surface and a second TSV conductively coupled to the second metal layer and extending through the second circuit layer to the first surface of the second circuit layer. The second superconducting circuit system further includes a second flux gasket conductively coupled to and extending from the second TSV on the first surface of the second circuit layer proximal to the second superconducting circuitry. The second flux gasket can be configured to divert magnetic fields away from the superconducting circuitry.

BRIEF DESCRIPTION OF THE DRAWINGS

FIG. 2 is an example diagram of a superconducting circuit layer.

DETAILED DESCRIPTION

Figure 1:
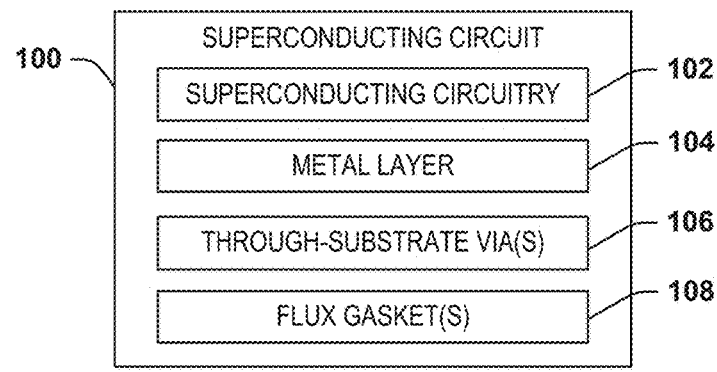
FIG. 1 is an example of a block diagram of a superconducting circuit system.

This description relates generally to electronic circuits, and more particularly to magnetic flux mitigation in superconducting circuits. A superconducting circuit described herein can include superconducting circuitry that is fabricated on a first surface of a circuit layer that also includes a second surface that is opposite the first surface. As described herein, the term "circuit layer" can refer to a wafer or die layer in which the superconducting circuit is fabricated in layers composed of metals (e.g., including superconducting metals) and dielectric materials. Therefore, the first and second surfaces can correspond to opposing surfaces of a wafer or die on which the superconducting circuit is fabricated. The superconducting circuit can also include a metal layer that is formed on the second surface, and at least one through-substrate via (TSV) that is conductively coupled to the metal layer and extends through the circuit layer (e.g., surrounded by dielectric material) from the second surface to the first surface of the circuit layer. The superconducting circuit can further include a flux gasket that extends from each of the TSV(s) on the first surface of the circuit layer and can be arranged proximal to the superconducting circuitry. The flux gasket can be configured to divert magnetic fields away from the superconducting circuitry.

As an example, the metal layer, the TSV(s), and the respective flux gasket(s) can be formed integral with each other. For example, the metal layer, the TSV(s), and the respective flux gasket(s) can be formed from a magnetic material, such as iron (Fe), iron-silicon (FeSi), cobalt (Co), nickel (Ni), or permalloy. As a result, magnetic flux that is provided through the superconducting circuit can align magnetic dipoles within the metal layer, the TSV(s), and the respective flux gasket(s) to isolate the magnetic fields to flowing through the metal layer, the TSV(s), and the respective flux gasket(s). For example, the superconducting circuitry can be arranged between (e.g., surrounded by) multiple flux gaskets that are associated with a respective array of TSVs. Therefore, the flux gaskets that are arranged near the superconducting circuitry can divert the magnetic fields away from the superconducting circuitry.

As an example, the superconducting circuit can be a first superconducting circuit, such that a second superconducting circuit can be fabricated substantially the same as the first superconducting circuit. For example, the second superconducting circuit can include second superconducting circuitry that is fabricated on a first surface of a second circuit layer that also includes a second surface that is opposite the first surface. The second superconducting circuit can also include a second metal layer that is formed on the second surface of the second circuit layer, and at least one second TSV that is conductively coupled to the second metal layer and extends through the second circuit layer (e.g., surrounded by dielectric material) from the second surface to the first surface of the second circuit layer. The second superconducting circuit can further include a second flux gasket that extends from each of the second TSV(s) on the first surface of the second circuit layer and can be arranged proximal to the second superconducting circuitry.

The first and second circuit layers can be stacked and inverted relative to each other, with the first surfaces of the respective first and second circuit layers facing each other. Therefore, the first and second superconducting circuitry can be conductively coupled via a bump bond, and the first and second TSV(s), as well as the first and second flux gaskets, can be axially aligned. As a result, magnetic flux that is provided through the superconducting circuits can be isolated in the metal layers, the TSVs, and the respective flux gaskets of the superconducting circuits, passing between the flux gaskets of the superconducting circuits to be diverted away from the superconducting circuitry. Accordingly, magnetic flux through the sensitive superconducting circuitry can be substantially mitigated.

FIG. 1 is an example of a block diagram of a superconducting circuit 100. The superconducting circuit 100 can be implemented in any of a variety of superconducting applications, such as a superconducting computer system. The superconducting circuit 100 includes superconducting circuitry 102 that is fabricated on a first surface of a circuit layer that also includes a second surface that is opposite the first surface. As an example, the superconducting layer can include a dielectric material. The superconducting circuit 100 also includes a metal layer 104 that is formed on the second surface of the circuit layer. The metal layer 104 can be arranged as a thin-film metallic material, and thus having a thickness that is less than a thickness of the dielectric material of the circuit layer. The superconducting circuit 100 also includes at least one through-substrate via (TSV) 106 that is conductively coupled to the metal layer 104 and extends through the circuit layer (e.g., surrounded by dielectric material) from the second surface to the first surface of the circuit layer. The superconducting circuit 100 further includes a flux gasket 108 that extends from each of the TSV(s) 106 on the first surface of the circuit layer and can be arranged proximal to the superconducting circuitry 102. The flux gasket 108 can be configured to divert magnetic fields away from the superconducting circuitry 102, as described in greater detail herein.

As an example, the metal layer 104, the TSV(s) 106, and the respective flux gasket(s) 108 can be formed integral with each other. For example, the metal layer 104, the TSV(s) 106, and the respective flux gasket(s) 108 can be formed from a magnetic material, such as iron (Fe), iron-silicon (FeSi), cobalt (Co), nickel (Ni), or permalloy. As a result, magnetic flux that is provided through the superconducting circuit 100 can align magnetic dipoles within the metal layer 104, the TSV(s) 106, and the respective flux gasket(s) 108 to isolate the magnetic fields to flowing through the metal layer 104, the TSV(s) 106, and the respective flux gasket(s) 108. For example, the superconducting circuitry 102 can be arranged between (e.g., surrounded by) multiple flux gaskets 108 that are associated with a respective array of TSVs 106. Therefore, the flux gaskets 108 that are arranged near the superconducting circuitry 102 can divert the magnetic fields away from the superconducting circuitry 102. Accordingly, the arrangement of the metal layer 104, the TSV(s) 106, and the respective flux gasket(s) 108 can provide a more deterministic, and thus less stochastic, process of diverting magnetic flux away from the superconducting circuitry 102.

As an example, the superconducting circuit 100 can be a first superconducting circuit, such that a second superconducting circuit can be fabricated substantially the same as the first superconducting circuit. Therefore, each of the superconducting circuits can include superconducting circuitry 102, a metal layer 104, TSV(s) 106, and flux gasket(s) 108 in a similar arrangement. For example, the first and second circuit layers can be stacked and inverted relative to each other, with the first surfaces of the respective first and second circuit layers facing each other. Therefore, the superconducting circuitry 102 of the first and second superconducting circuits can be conductively coupled via a bump bond. As an example, the TSV(s) 106 of the first and second superconducting circuits, and thus the respective flux gaskets 108, can be axially aligned. As a result, magnetic flux that is provided through the superconducting circuits can be isolated in the metal layers 104, the TSVs 106, and the respective flux gaskets 108 of the superconducting circuits. The magnetic field that passes through the metal layer 104, along the TSV(s) 106, and into the flux gasket(s) 108 of the first superconducting circuit thus passes through a small air gap between the superconducting circuits to the flux gasket(s) 108, along the TSV(s) 106, and to the metal layer 104 of the other of the superconducting circuits. Accordingly, magnetic flux through the sensitive superconducting circuitry 102 can be substantially mitigated.

FIG. 2 is an example diagram 200 of a superconducting circuit. The superconducting circuit is demonstrated in the diagram 200 in a first view 202 and in a second view 204. The first view 202 corresponds to a cross-sectional view of the superconducting circuit that can extend farther in each direction in the XZ-plane. The second view 204 corresponds to a plan view along the Y-axis. The superconducting circuit can correspond to the superconducting circuit 100 in the example of FIG. 1. Therefore, reference is to be made to the example of FIG. 1 in the following description of the example of FIG. 2.

In the example of FIG. 2, the superconducting circuit includes a circuit layer 206. The circuit layer 206 can correspond to a dielectric material between a first surface 208 and a second surface 210. The superconducting circuit includes superconducting circuitry 212 distributed in multiple locations along the first surface 208 of the circuit layer 206. Additionally, the superconducting circuit includes a plurality of flux gaskets 214 on the first surface 208. In the example of FIG. 2, in the second view 204, the superconducting circuitry 212 and the flux gaskets 214 are arranged in an alternating array, such that each set of the superconducting circuitry 212 is arranged between flux gaskets 214. Particularly, in the example of FIG. 2, the superconducting circuitry 212 is surrounded in orthogonal directions in the XZ-plane by flux gaskets 214. In the example of FIG. 2, the superconducting circuitry 212 and the flux gaskets 214 are demonstrated as having square shapes in the XZ-plane. However, other shapes and arrangements (e.g., circular, rectangular, or non-symmetrical shapes) are possible alternatives.

The superconducting circuit also includes a plurality of TSVs 216 that extend between the first surface 208 and the second surface 210 of the circuit layer 206. Each of the TSVs 216 is conductively coupled to a metal layer 218 that is deposited on the second surface 210 of the circuit layer 206. Each of the TSVs 216 is also conductively coupled to a respective one of the flux gaskets 214, such that the TSVs 216 provide conductive coupling between the metal layer 218 and the flux gaskets 214. For example, the metal layer 218, the TSVs 216, and the flux gaskets 214 can be formed from a magnetic material, such as iron (Fe), iron-silicon (FeSi), cobalt (Co), nickel (Ni), or permalloy, and can be formed integral with respect to each other. In the example of FIG. 2, the TSVs 216 are demonstrated as having a square cross-sectional shape in the XZ-plane, but can be arranged in any of a variety of other cross-sectional shapes, and can be solid, hollow, or filled with a dielectric material.

As an example, the superconducting circuit can be formed by first depositing a metallic material to form the metal layer 218. The TSVs 216 can then be formed on the metal layer 218, followed by deposition of the dielectric material to form the circuit layer 206. The dielectric material of the circuit layer 206 can thus surround each of the TSVs 216, such that the TSVs 216 extend from the first surface 208 to the second surface 210 of the circuit layer 206. The flux gaskets 214 can then be formed on the first surface 208 of the circuit layer 206 in conductive contact with the respective TSVs 216. Finally, the superconducting circuitry 212 can be fabricated on the first surface 208 of the circuit layer 206 on the spaces between the flux gaskets 214.

As described above in the example of FIG. 1, a superconducting circuit system can include two superconducting circuits. Therefore, the superconducting circuit in the diagram 200 can be one of two superconducting circuits that form a superconducting circuit system.

Figure 3:
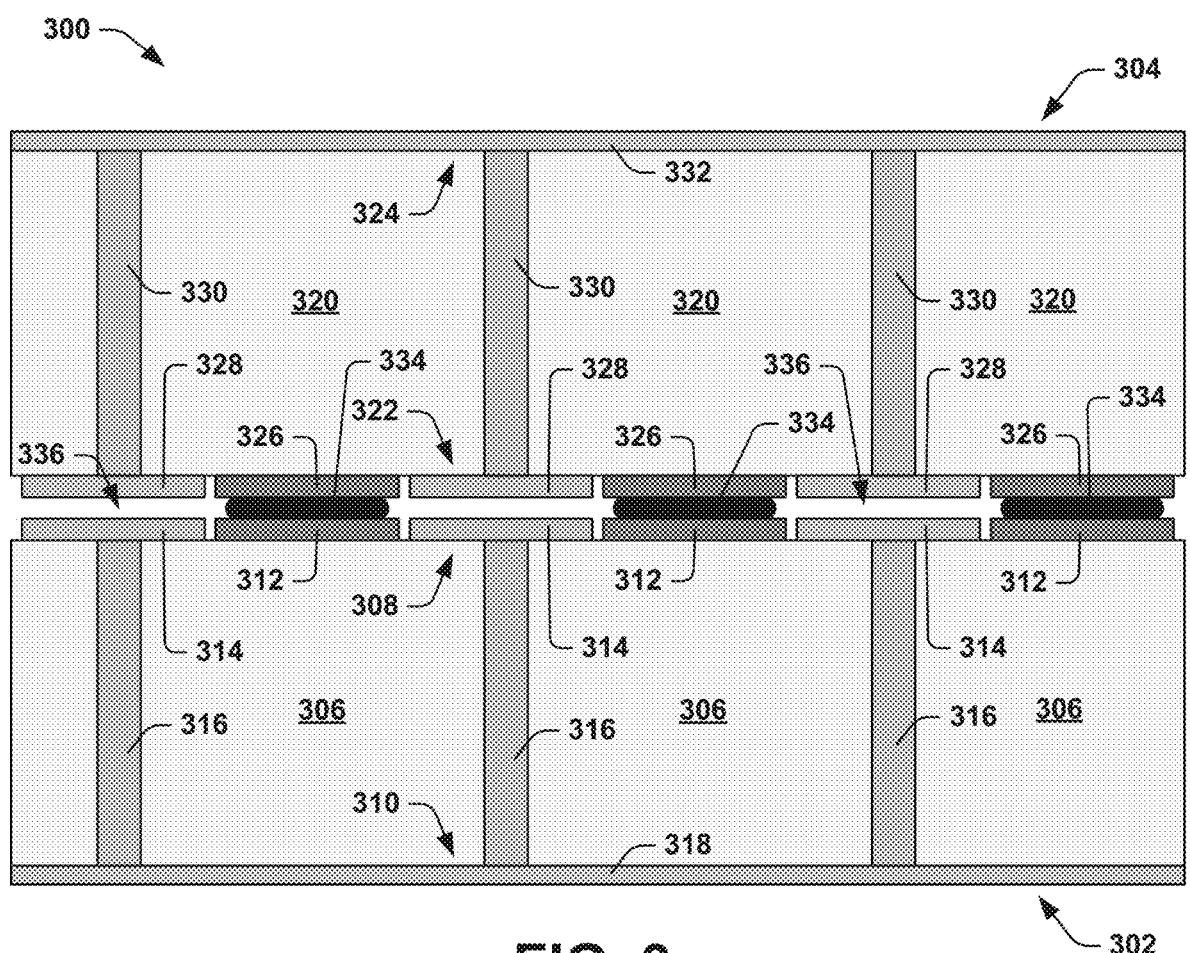
FIG. 3 is an example diagram of a superconducting circuit system.

FIG. 3 is an example of a superconducting circuit system 300. The superconducting circuit system 300 includes a first superconducting circuit 302 and a second superconducting circuit 304. Each of the superconducting circuits 302 and 304 can correspond to the superconducting circuit 100 or the superconducting circuit in the respective examples of FIGS. 1 and 2. Therefore, reference is to be made to the examples of FIGS. 1 and 2 in the following description of the example of FIG. 3.

In the example of FIG. 3, the first and second superconducting circuits 302 and 304 are demonstrated as fabricated approximately the same as the superconducting circuit in the example of FIG. 2. Therefore, the first superconducting circuit 302 includes a circuit layer 306 having a first surface 308 and a second surface 310, and superconducting circuitry 312 distributed in multiple locations along the first surface 308 of the circuit layer 306. Additionally, the first superconducting circuit 302 includes a plurality of flux gaskets 314 on the first surface 308, a respective plurality of TSVs 316 that extend between the first surface 308 and the second surface 310 of the circuit layer 306, and a metal layer 318 that is deposited on the second surface 310 of the circuit layer 306. Thus, each of the TSVs 316 is conductively coupled to the metal layer 318 and a respective one of the flux gaskets 314.

Similarly, the second superconducting circuit 304 includes a circuit layer 320 having a first surface 322 and a second surface 324, and superconducting circuitry 326 distributed in multiple locations along the first surface 322 of the circuit layer 320. Additionally, the second superconducting circuit 304 includes a plurality of flux gaskets 328 on the first surface 308, a respective plurality of TSVs 330 that extend between the first surface 322 and the second surface 324 of the circuit layer 320, and a metal layer 332 that is deposited on the second surface 324 of the circuit layer 320. Thus, each of the TSVs 330 is conductively coupled to the metal layer 332 and a respective one of the flux gaskets 328.

In the example of FIG. 3, the superconducting circuits 302 and 304 are arranged as inverted and stacked with respect to each other, such that the first surfaces 308 and 322 of the respective circuit layers 306 and 320 face each other. The first and second superconducting circuitry 312 and 326 are demonstrated as conductively coupled via bump bonds 334. The arrangement of the superconducting circuits 302 and 304 provides an air gap 336 between the first surfaces 308 and 322 of the respective circuit layers 306 and 320 in the regions around the bump bonds 334. While the gap described herein is an air gap 336, it could instead be filled with a dielectric material, as an example. Based on the inverted and stacked arrangement of the superconducting circuits 302 and 304, in the example of FIG. 3, the TSVs 316 are axially aligned with respect to the TSVs 330. Therefore, the flux gaskets 314 are likewise axially aligned with the flux gaskets 328.

Based on the inverted and stacked arrangement of the superconducting circuits 302 and 304, the metal layers 318 and 332, the TSVs 316 and 330, and the flux gaskets 314 and 328 cooperate to divert magnetic fields away from the superconducting circuitry 312 and 326. For example, in response to a magnetic flux that is provided to the first superconducting circuit 302, the magnetic flux is provided to the metal layer 318. The magnetic dipoles of the metal layer 318, the TSVs 316, and the flux gaskets 314 can align, such that the magnetic flux is provided as a magnetic field through the metal layer 318 and along the TSVs 316. The magnetic field can thus be provided into the flux gaskets 314 from the TSVs 316. However, instead of flaring out to pass through the superconducting circuitry 312, the magnetic field can be passed across the air gap 336 to the flux gaskets 328, the dipoles of which being similarly aligned. Thus, the magnetic field can pass from the flux gaskets 328, along the TSVs 330, and to the metal layer 332 to complete a magnetic field circuit. Therefore, the magnetic field is confined to the TSVs 316 and 330 and the flux gaskets 314 and 328 between the metal layers 318 and 332, and thus through the superconducting circuit system 300. As a result, magnetic flux through the superconducting circuit system 300 can be mitigated.

Figure 4:
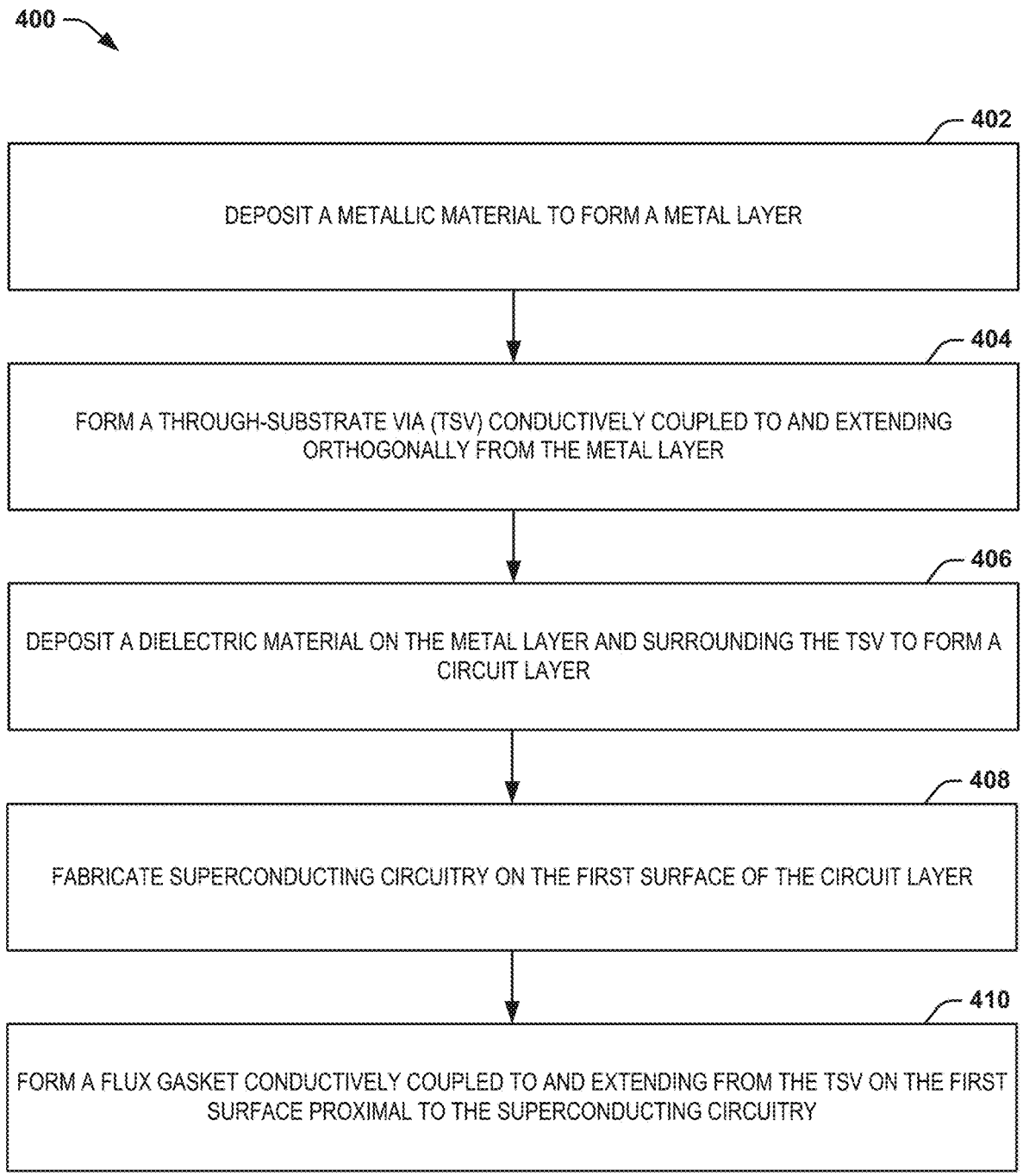
FIG. 4 is an example of a method for fabricating a superconducting circuit system.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 is an example of a method 400 for fabricating a superconducting circuit (e.g., the superconducting circuit 100). At 402, a metallic material is deposited to form a metal layer (e.g., the metal layer 104). At 404, a TSV (e.g., the TSV(s) 106) is formed conductively coupled to and extending orthogonally from the metal layer. At 406, a dielectric material is deposited on the metal layer and surrounding the TSV to form a circuit layer (e.g., the circuit layer 206). The circuit layer can include a first surface (e.g., the first surface 208) and a second surface (e.g., the second surface 210) opposite the first surface and in contact with the metal layer. At 408, superconducting circuitry (e.g., the superconducting circuitry 102) on the first surface of the circuit layer. At 410, a flux gasket (e.g., the flux gasket(s) 108) conductively coupled to and extending from the TSV on the first surface proximal to the superconducting circuitry. The flux gasket can be configured to divert magnetic fields away from the superconducting circuitry What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A superconducting circuit comprising:
    superconducting circuitry fabricated on a first surface of a circuit layer, the circuit layer comprising a dielectric material;
    a metal layer formed on a second surface of the circuit layer opposite the first surface;
    a through-substrate via (TSV) conductively coupled to the metal layer and extending through the circuit layer to the first surface; and
    a flux gasket conductively coupled to and extending from the TSV on the first surface proximal to the superconducting circuitry, the flux gasket being configured to divert magnetic fields away from the superconducting circuitry.

2. The circuit of claim 1, wherein the metal layer, at least a portion of the TSV, and the flux gasket are formed integral with respect to each other.

3. The circuit of claim 2, wherein the metal layer, at least a portion of the TSV, and the flux gasket are formed from a magnetic material.

4. The circuit of claim 1, wherein the TSV is one of a plurality of TSVs arranged in an array in the circuit layer, wherein each of the TSVs comprises a respective flux gasket, wherein the superconducting circuitry is arranged between the respective flux gasket associated with at least two of the TSVs.

5. The circuit of claim 1, wherein the superconducting circuitry is first superconducting circuitry fabricated on a first circuit layer, wherein the metal layer is a first metal layer, wherein the TSV is a first TSV, and the flux gasket is a first flux gasket, the circuit further comprising:
    second superconducting circuitry fabricated on a first surface of the second circuit layer, the second circuit layer comprising the dielectric material;
    a second metal layer formed on a second surface of the second circuit layer opposite the first surface;
    a second TSV conductively coupled to the second metal layer and extending through the second circuit layer to the first surface; and
    a second flux gasket conductively coupled to and extending from the second TSV on the first surface proximal to the second superconducting circuitry.

6. The circuit of claim 5, wherein the first and second superconducting layers are arranged as inverted and stacked with respect to each other, such that the first surface of the first circuit layer faces the first surface of the second circuit layer.

7. The circuit of claim 6, wherein the first TSV and the second TSV are axially aligned, such that the first flux gasket is axially aligned with the second flux gasket and separated by a gap between the first surface of the first circuit layer and the first surface of the second circuit layer.

8. The circuit of claim 6, wherein the first and second superconducting circuitry are conductively coupled via a bump bond.

9. The circuit of claim 6, wherein the first TSV is one of a plurality of first TSVs arranged in an array in the first circuit layer, wherein each of the first TSVs comprises a respective first flux gasket, wherein the first superconducting circuitry is arranged between the respective first flux gasket associated with at least two of the first TSVs, wherein the second TSV is one of a plurality of second TSVs arranged in an array in the second circuit layer, wherein each of the second TSVs comprises a respective second flux gasket, wherein the second superconducting circuitry is arranged between the respective second flux gasket associated with at least two of the second TSVs, wherein each of the first TSVs is axially aligned with a respective one of the second TSV, such that the first flux gasket of each of the first TSVs is axially aligned with the second flux gasket of each of the respective second TSVs and separated by a gap between the first surface of the first circuit layer and the first surface of the second circuit layer.

10. An integrated circuit comprising the superconducting circuit of claim 1.

11. A method for fabricating a superconducting circuit, the method comprising:
    depositing a metallic material to form a metal layer;
    forming a through-substrate via (TSV) conductively coupled to and extending orthogonally from the metal layer;
    depositing a dielectric material on the metal layer and surrounding the TSV to form a circuit layer, the circuit layer comprising a first surface and a second surface opposite the first surface and in contact with the metal layer;
    fabricating superconducting circuitry on the first surface of the circuit layer; and
    forming a flux gasket conductively coupled to and extending from the TSV on the first surface proximal to the superconducting circuitry, the flux gasket being configured to divert magnetic fields away from the superconducting circuitry.

12. The method of claim 11, wherein depositing the metallic material comprises depositing a magnetic material to form the metal layer, wherein forming the TSV comprises forming the TSV from the soft magnetic material, and wherein forming the flux gasket comprises forming the forming the flux gasket from the soft magnetic material.

13. The method of claim 11, wherein forming the TSV comprises forming a plurality of TSVs arranged in an array, each of the TSVs being conductively coupled to and extending orthogonally from the metal layer, wherein depositing the dielectric material comprises depositing the dielectric material on the metal layer and surrounding each of the TSVs to form the circuit layer.

14. The method of claim 11, wherein the superconducting circuitry is first superconducting circuitry fabricated on a first circuit layer, wherein the metal layer is a first metal layer, wherein the TSV is a first TSV, and the flux gasket is a first flux gasket, the method further comprising:
  depositing the metallic material to form a second metal layer;
  forming a second TSV conductively coupled to and extending orthogonally from the second metal layer;
  depositing the dielectric material on the second metal layer and surrounding the second TSV to form a second circuit layer, the second circuit layer comprising a first surface and a second surface opposite the first surface and in contact with the second metal layer;
  fabricating second superconducting circuitry on the first surface of the second circuit layer;
  forming a second flux gasket conductively coupled to and extending from the second TSV on the first surface proximal to the second superconducting circuitry; and
  conductively coupling the first superconducting circuity to the second superconducting circuitry via a bump bond.

15. The method of claim 14, wherein the first TSV and the second TSV are axially aligned, such that the first flux gasket is axially aligned with the second flux gasket and separated by a gap between the first surface of the first circuit layer and the first surface of the second circuit layer.

16. An integrated circuit comprising:
  a first superconducting circuit system comprising:
    first superconducting circuitry fabricated on a first surface of a first circuit layer, the first circuit layer comprising a dielectric material;
    a first metal layer formed on a second surface of the first circuit layer opposite the first surface;
    a first through-substrate via (TSV) conductively coupled to the first metal layer and extending through the first circuit layer to the first surface; and
    a first flux gasket conductively coupled to and extending from the first TSV on the first surface proximal to the first superconducting circuitry, the first flux gasket being configured to divert magnetic fields away from the superconducting circuitry; and
  a second superconducting circuit system comprising:
    second superconducting circuitry fabricated on a first surface of a second circuit layer, the second circuit layer comprising the dielectric material;
    a second metal layer formed on a second surface of the second circuit layer opposite the first surface;
    a second TSV conductively coupled to the second metal layer and extending through the second circuit layer to the first surface of the second circuit layer; and
    a second flux gasket conductively coupled to and extending from the second TSV on the first surface of the second circuit layer proximal to the second superconducting circuitry, the second flux gasket being configured to divert magnetic fields away from the superconducting circuitry.

17. The circuit of claim 16, wherein the first and second superconducting layers are arranged as inverted and stacked with respect to each other, such that the first surface of the first circuit layer faces the first surface of the second circuit layer.

18. The circuit of claim 17, wherein the first TSV and the second TSV are axially aligned, such that the first flux gasket is axially aligned with the second flux gasket and separated by a gap between the first surface of the first circuit layer and the first surface of the second circuit layer.

19. The circuit of claim 17, wherein the first and second superconducting circuitry are conductively coupled via a bump bond.

20. The circuit of claim 17, wherein the first TSV is one of a plurality of first TSVs arranged in an array in the first circuit layer, wherein each of the first TSVs comprises a respective first flux gasket, wherein the first superconducting circuitry is arranged between the respective first flux gasket associated with at least two of the first TSVs, wherein the second TSV is one of a plurality of second TSVs arranged in an array in the second circuit layer, wherein each of the second TSVs comprises a respective second flux gasket, wherein the second superconducting circuitry is arranged between the respective second flux gasket associated with at least two of the second TSVs, wherein each of the first TSVs is axially aligned with a respective one of the second TSV, such that the first flux gasket of each of the first TSVs is axially aligned with the second flux gasket of each of the respective second TSVs and separated by a gap between the first surface of the first circuit layer and the first surface of the second circuit layer.

* * * * *